United States Patent
Adachi

(10) Patent No.: US 9,130,593 B2
(45) Date of Patent: Sep. 8, 2015

(54) DATA PROCESSING METHOD

(71) Applicant: FUJITSU SEMICONDUCTOR LIMITED, Yokohama-shi, Kanagawa (JP)

(72) Inventor: Naoto Adachi, Yokohama (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/310,878

(22) Filed: Jun. 20, 2014

(65) Prior Publication Data

US 2014/0301506 A1 Oct. 9, 2014

Related U.S. Application Data

(62) Division of application No. 12/829,847, filed on Jul. 2, 2010, now Pat. No. 8,832,533.

(30) Foreign Application Priority Data

Jul. 3, 2009 (JP) .................. 2009-159008

(51) Int. Cl.
*H03M 13/27* (2006.01)
*H03M 13/29* (2006.01)
*H03M 13/00* (2006.01)
(Continued)

(52) U.S. Cl.
CPC ...... *H03M 13/2782* (2013.01); *H03M 13/2789* (2013.01); *H03M 13/2936* (2013.01); *H03M 13/6306* (2013.01); *H04L 1/0052* (2013.01); *H04L 1/0054* (2013.01);
(Continued)

(58) Field of Classification Search
CPC .................. H04L 27/2647; H03M 13/2782
See application file for complete search history.

(56) References Cited

U.S. PATENT DOCUMENTS 5,844,946 A * 12/1998 Nagayasu .................. 375/341
6,302,576 B1 * 10/2001 Ono et al. .................. 714/794
(Continued)

FOREIGN PATENT DOCUMENTS

EP 2 001 151 A2 12/2008
JP 2001-274696 A 10/2001
(Continued)

OTHER PUBLICATIONS

Japanese Office Action issued Mar. 5, 2013, in counterpart Japanese Patent Application No. 2009-159008 (7 pages including English Translation).

*Primary Examiner* — Steve Nguyen
(74) *Attorney, Agent, or Firm* — Arent Fox LLP

(57) ABSTRACT

A data receiving circuit includes: a first de-interleave circuit configured to de-interleave first data which is demodulated and is soft-decision-processed; a second de-interleave circuit configured to de-interleave second data which is demodulated and is soft-decision-processed; a memory configured to be shared by the first de-interleave circuit and the second de-interleave circuit and store respective hard decision information and respective soft decision information of the first data and the second data; and a memory control circuit configured to vary a first through fourth number of bits stored in the memory, the first number corresponding to the hard decision information of the first data, the second number corresponding to the soft decision information of the first data, the third number corresponding to the hard decision information of the second data, the fourth number corresponding to the soft decision information of the second data.

4 Claims, 15 Drawing Sheets

(51) Int. Cl.
*H04L 1/00* (2006.01)
*H04L 27/26* (2006.01)
*H03M 13/41* (2006.01)

(52) U.S. Cl.
CPC ......... *H04L 1/0071* (2013.01); *H04L 27/2647* (2013.01); *H03M 13/41* (2013.01)

(56) References Cited

U.S. PATENT DOCUMENTS

| | | | |
|---|---|---|---|
| 7,236,591 B2 * | 6/2007 | Sim | 380/33 |
| 8,019,029 B1 * | 9/2011 | Katic | 375/346 |
| 8,179,980 B2 * | 5/2012 | Limberg | 375/240.27 |
| 2002/0071504 A1 * | 6/2002 | Chen et al. | 375/341 |
| 2005/0154963 A1 * | 7/2005 | Lee | 714/763 |
| 2007/0288832 A1 | 12/2007 | Adachi | |
| 2009/0041165 A1 * | 2/2009 | Higashinaka | 375/341 |
| 2009/0052544 A1 * | 2/2009 | Limberg | 375/240.24 |
| 2009/0103601 A1 * | 4/2009 | Du et al. | 375/240 |
| 2009/0232256 A1 * | 9/2009 | Gu | 375/341 |
| 2010/0321586 A1 * | 12/2010 | Yang | 348/726 |

FOREIGN PATENT DOCUMENTS

| | | | | |
|---|---|---|---|---|
| JP | 2001-320345 A | | 11/2001 | |
| JP | 2003-101505 A | | 4/2003 | |
| JP | 2004-236040 A | | 8/2004 | |
| JP | 2005-006118 A | | 1/2005 | |
| JP | 2005-318374 A | | 11/2005 | |
| JP | 2007-068038 A | | 3/2007 | |
| JP | 2007-68038 A | * | 3/2007 | H04J 11/00 |
| JP | 2007-318330 A | | 12/2007 | |
| JP | 2008-516533 A | | 5/2008 | |
| JP | 2008-199142 A | | 8/2008 | |
| JP | 2009-147682 A | | 7/2009 | |
| WO | WO 2006/044227 A1 | | 4/2006 | |

* cited by examiner

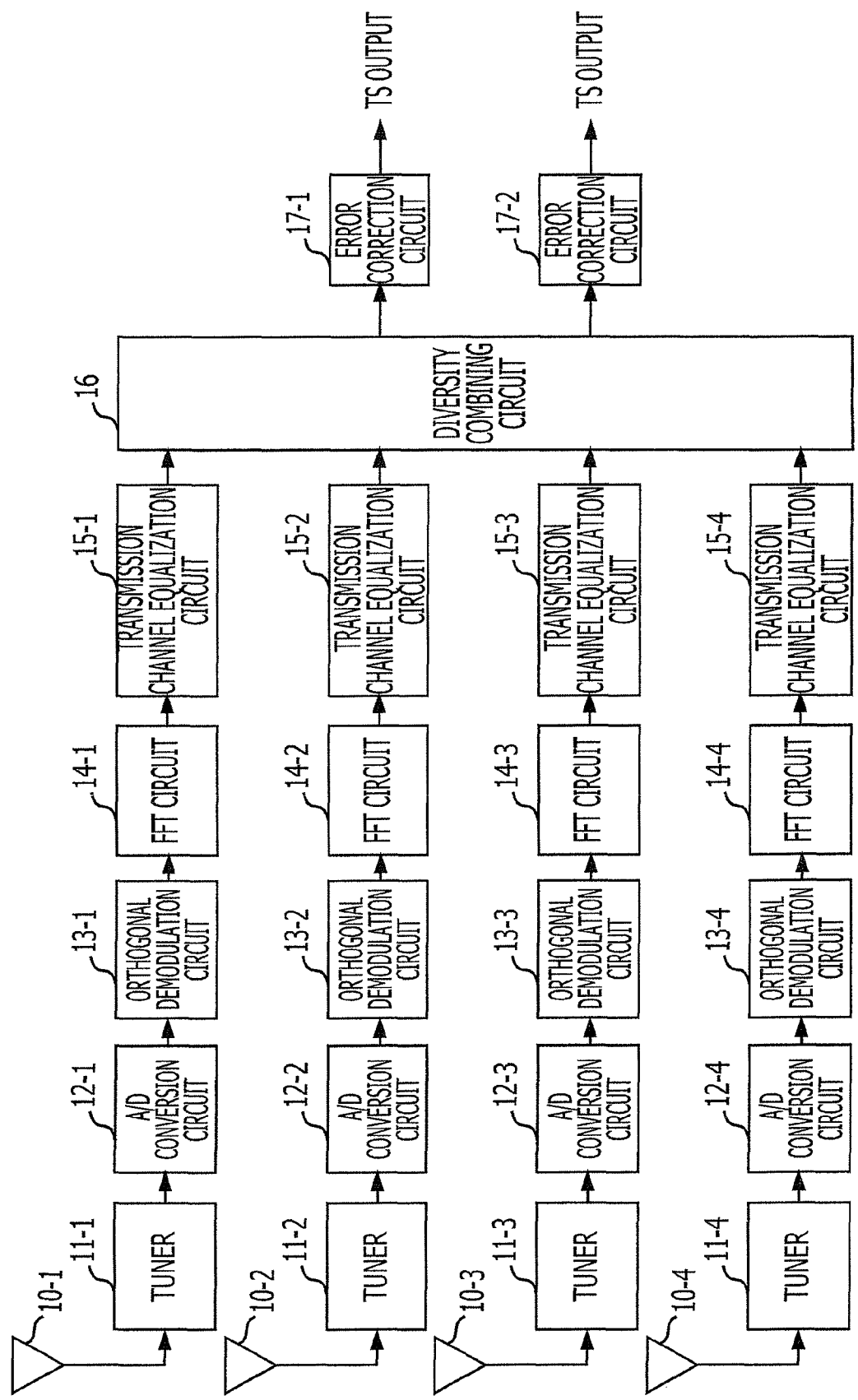

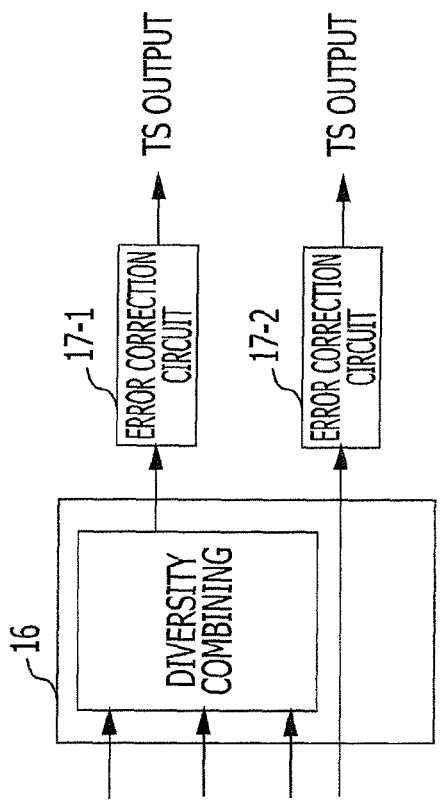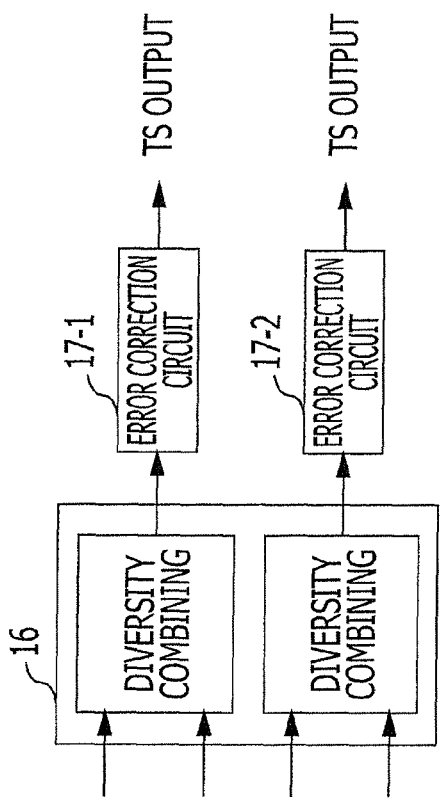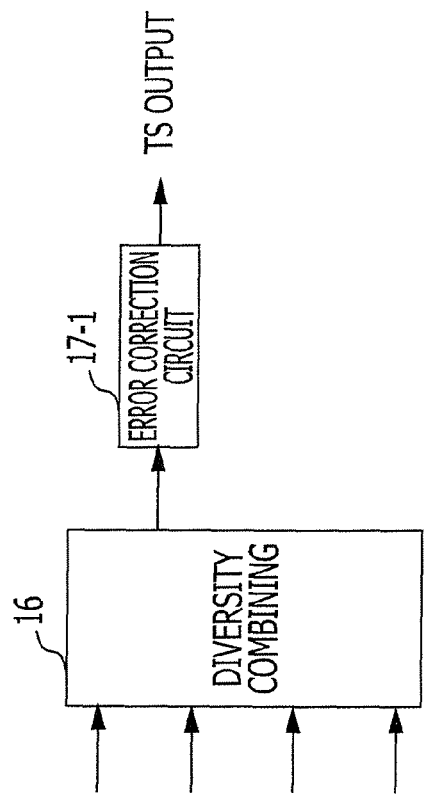

FIG. 4A

| Bit | | CONTENTS | | |
|---|---|---|---|---|
| 0 | 1 | STANDARD FOR DIFFERENTIAL DEMODULATION | | |
| 1~16 | 15 | SYNCHRONOUS SIGNAL | | |
| 17~19 | 3 | SEGMENT FORMAT IDENTIFICATION | | |
| 20~21 | 2 | SYSTEM IDENTIFICATION | | |
| 22~25 | 4 | TRANSMISSION PARAMETER SWITCHING INDEX | | |
| 26 | 1 | ACTIVATION FLAG FOR EMERGENCY ALERT BROADCASTING | | |
| 27 | 1 | | PARTIAL RECEPTION FLAG | |
| 28~30 | 3 | | A | MODULATION METHOD |
| 31~33 | 4 | | A | CONVOLUTION ENCODING RATIO |
| 34~36 | 3 | | A | INTERLEAVE LENGTH |
| 37~40 | 3 | | A | NUMBER OF SEGMENT |
| 41~43 | 3 | CURRENT INFORMATION | B | MODULATION METHOD |
| 44~46 | 4 | | B | CONVOLUTION ENCODING RATIO |
| 47~49 | 3 | | B | INTERLEAVE LENGTH |
| 50~53 | 4 | | B | NUMBER OF SEGMENT |
| 54~56 | 3 | | C | MODULATION METHOD |
| 57~59 | 3 | | C | CONVOLUTION ENCODING RATIO |
| 60~62 | 3 | | C | INTERLEAVE LENGTH |
| 63~66 | 4 | | C | NUMBER OF SEGMENT |
| 67 | 1 | | PARTIAL RECEPTION FLAG | |
| 68~70 | 3 | | A | MODULATION METHOD |
| 71~73 | 3 | | A | CONVOLUTION ENCODING RATIO |
| 74~76 | 3 | | A | INTERLEAVE LENGTH |
| 77~80 | 4 | | A | NUMBER OF SEGMENT |
| 81~83 | 3 | NEXT INFORMATION | B | MODULATION METHOD |
| 84~86 | 3 | | B | CONVOLUTION ENCODING RATIO |
| 87~89 | 3 | | B | INTERLEAVE LENGTH |
| 90~93 | 4 | | B | NUMBER OF SEGMENT |
| 94~96 | 3 | | C | MODULATION METHOD |
| 97~99 | 3 | | C | CONVOLUTION ENCODING RATIO |
| 100~102 | 3 | | C | INTERLEAVE LENGTH |
| 103~106 | 4 | | C | NUMBER OF SEGMENT |
| 107~109 | 3 | * LINK TRANSMISSION PHASE CORRECTION AMOUNT | | |
| 110~121 | 15 | Reserve(All '1') | | |
| 122~203 | 82 | PARITY FOR ERROR CORRECTION | | |

FIG. 4B

| SEGMENT FORMAT IDENTIFICATION | 000 | SYNCHRONOUS DEMODULATION |
|---|---|---|
| | 111 | SYNCHRONOUS DEMODULATION |
| SYSTEM IDENTIFICATION | 00 | TERRESTRIAL DIGITAL TELEVISION BROADCASTING SYSTEM |
| | 01 | TERRESTRIAL AUDIO BROADCASTING SYSTEM |
| | 1x | Reserve |
| TRANSMISSION PARAMETER SWITCHING INDEX | 1111 | NORMAL VALUE |
| | 1110~0000 | PARAMETER IS SWITCHED AFTER VALUE MINUS ONE |
| ACTIVATION FLAG FOR EMERGENCY ALERT BROADCASTING | 0 | Disable |
| | 1 | Enabke |
| PARTIAL RECEPTION FLAG | 0 | Disable |
| | 1 | Enabke |
| MODULATION METHOD | 000 | DQPSK |
| | 001 | QPSK |
| | 010 | 16QAM |
| | 011 | 64QAM |
| | 100~110 | Reserve |
| | 111 | UNUSED LAYER |
| CONVOLUTION ENCODING RATIO | 000 | 1/2 |
| | 001 | 2/3 |
| | 010 | 3/4 |
| | 011 | 5/6 |
| | 100 | 7/8 |
| | 101~110 | Reserve |
| | 111 | UNUSED LAYER |
| INTERLEAVE LENGTH | 000 | 0 |
| | 001 | 4(Model1),2(Model2),1(Model3) |
| | 010 | 8(Model1),4(Model2),2(Model3) |
| | 011 | 16(Model1),8(Model2),4(Model3) |
| | * 101 | *32(Model1),16(Model2),8(Model3) |
| | 101~110 | Reserve |
| | 111 | UNUSED LAYER |
| NUMBER OF SEGMENT | 0000 | Reserve |
| | 0001~1101 | VALUE INDICATE NUMBER OF SEGMENT |
| | 1110 | Reserve |
| | 1111 | UNUSED LAYER |
| * LINK TRANSMISSION PHASE CORRECTION AMOUNT | 000 | $-\pi/4$ |
| | 001 | $-2\pi/4$ |
| | 010 | $-3\pi/4$ |
| | 011 | $-4\pi/4$ |
| | 100 | $-5\pi/4$ |
| | 101 | $-6\pi/4$ |
| | 110 | $-7\pi/4$ |
| | 111 | 0 |

FIG. 6

| MODULATION METHOD | NUMBER OF SOFT DECISION BIT | | | | |
|---|---|---|---|---|---|
| | 1 | 2 | 3 | 4 | 5 |
| QPSK | 2 | 4 | 6 | 8 | 10 |
| 16QAM | 4 | 8 | 10 | 12 | 14 |
| 64QAM | 6 | 12 | 14 | 16 | 18 |

DATA PROCESSING METHOD

CROSS-REFERENCE TO RELATED APPLICATION

This is a Divisional Application of U.S. patent application Ser. No. 12/829,847, filed Jul. 2, 2010, which claims priority to Japanese Patent Application No. 2009-159008, filed Jul. 3, 2009. The disclosures of the prior applications are hereby incorporated in their entirety by reference.

BACKGROUND

1. Field

The embodiments discussed herein relate to a receiving circuit.

2. Description of Related Art

In an orthogonal frequency division multiplexing (OFDM) method used for transmitting a digital signal, data may be allocated to a plurality of mutually orthogonal carriers. At a transmitting side, data may be modulated by using inverse fast fourier transform (IFFT). Then, at a receiving side, data may be demodulated by using fast fourier transform (FFT). Since the OFDM method has high frequency usage efficiency, the OFDM method may be adopted for Integrated Services Digital Broadcasting-Terrestrial (ISDB-T), a standard for terrestrial digital broadcasting.

Related techniques are disclosed in Japanese Laid-open Patent Publication No. 2007-68038, Japanese Laid-open Patent Publication No. 2001-274696, Japanese Laid-open Patent Publication No. 2005-318374, Japanese Laid-open Patent Publication No. 2001-320345, Japanese Laid-open Patent Publication No. 2003-101505, and Japanese Laid-open Patent Publication No. 2007-318330.

SUMMARY

According to one aspect of the embodiments, a data receiving circuit is provided which includes a first de-interleave circuit configured to de-interleave first data which is demodulated and is soft-decision-processed; a second de-interleave circuit configured to de-interleave second data which is demodulated and is soft-decision-processed; a memory configured to be shared by the first de-interleave circuit and the second de-interleave circuit and store respective hard decision information and respective soft decision information of the first data and the second data; and a memory control circuit configured to vary first through fourth numbers of bits stored in the memory. The first number corresponds to the hard decision information of the first data. The second number corresponds to the soft decision information of the first data. The third number corresponds to the hard decision information of the second data. The fourth number corresponds to the soft decision information of the second data.

Additional advantages and novel features of the invention will be set forth in part in the description that follows, and in part will become more apparent to those skilled in the art upon examination of the following or upon learning by practice of the invention.

BRIEF DESCRIPTION OF THE DRAWINGS

FIG. 1 illustrates an exemplary receiver;
FIGS. 2A, 2B, and 2C illustrate exemplary diversity combinations;
FIGS. 4A and 4B illustrate an exemplary allocation of TMCC information;
FIG. 6 illustrates an exemplary number of bits used for soft decision information.

DESCRIPTION OF EMBODIMENTS

Figure 3:
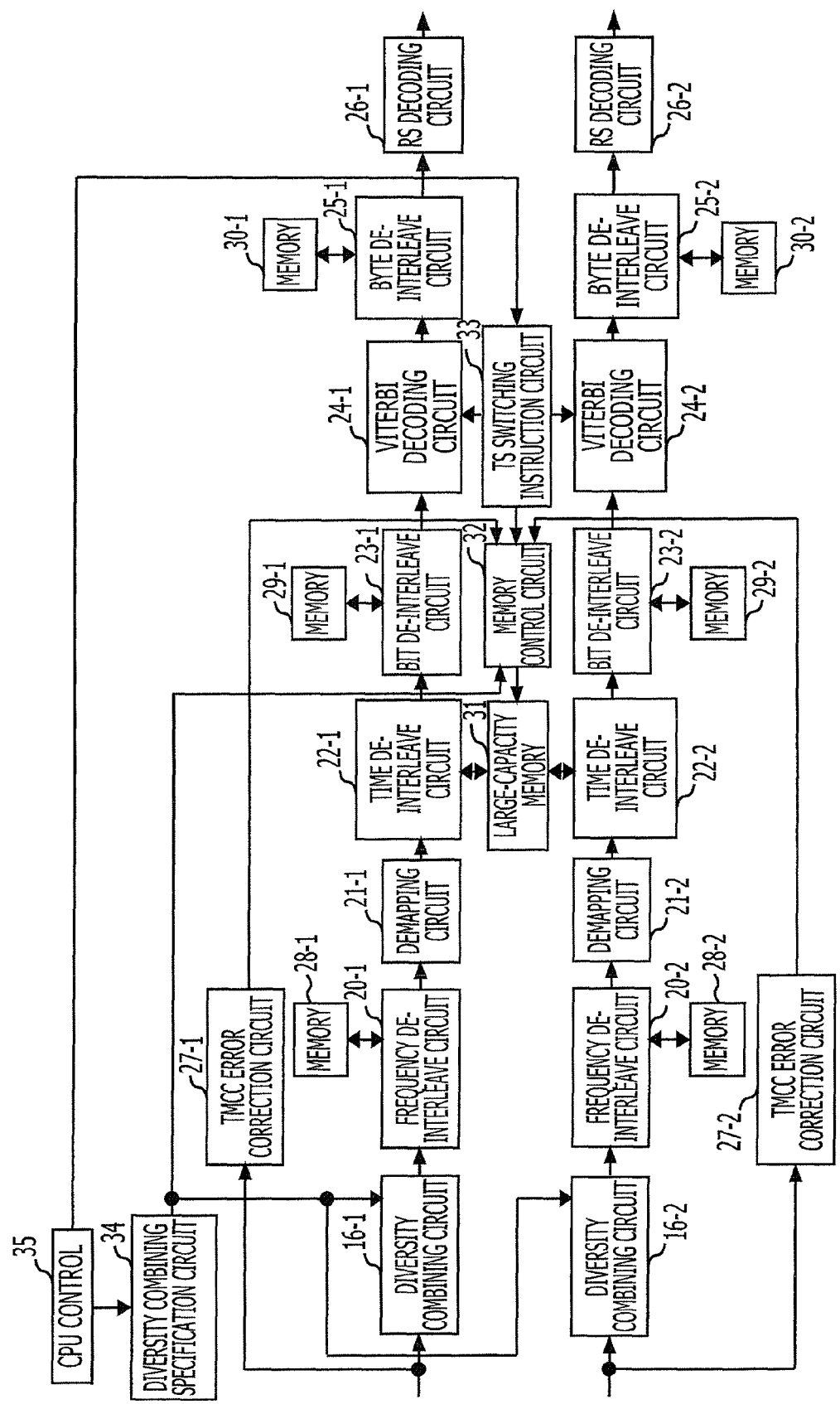
FIG. 3 illustrates an exemplary error correction circuit.

A signal received by an antenna may be demodulated by using FFT. An error correction section may perform a demapping process on demodulated data. Maximum likelihood decision may be performed on data subjected to soft decision processing using Viterbi decoding. Then, data subjected to the maximum likelihood decision may be error-corrected using Reed-Solomon (RS) decoding. The error-corrected data may be output as a transport stream (TS). An MPEG decoder or the like, provided in a stage subsequent to an OFDM demodulating circuit, may decode the transport stream.

The error correction section may perform de-interleave process. Examples of the de-interleave process may include a frequency de-interleave process in which sorting in the frequency axis direction is performed, a time de-interleave process in which sorting in the time axis direction is performed, a bit de-interleave process in which sorting in units of bits is performed, and a byte de-interleave process in which sorting in units of bytes is performed. A memory for storing data temporarily may be provided.

In ISDB-T, a standard for terrestrial digital broadcasting, a bandwidth of six MHz, allocated to one channel, is divided into 13 segments. One segment among the 13 segments adopts a modulation method such as quadrature phase shift keying (QPSK) or the like, which has a low bit rate and high noise tolerance, and is used for broadcasting for a mobile receiver such as a mobile phone or the like. The other 12 segments adopt a modulation method such as 64 quadrature amplitude modulation (64 QAM) or the like, which has a high bit rate and low noise tolerance, and are used for broadcasting for a fixed terminal.

In an in-vehicle terminal, 12-segment broadcasting may be received using diversity combining. For example, four antennas may perform four-diversity reception. Two channels may be used contemporaneously. Alternatively, one channel may be used for viewing and the other channel may be used for recording. Therefore, two TS outputs may be provided.

FIG. 1 illustrates an exemplary receiver. The receiver illustrated in FIG. 1 may perform diversity combining. The receiver includes antennas 10-1 to 10-4, tuners 11-1 to 11-4, A/D conversion circuits 12-1 to 12-4, orthogonal demodulation circuits 13-1 to 13-4, FFT circuits 14-1 to 14-4, and transmission channel equalization circuits 15-1 to 15-4. The receiver includes a diversity combining circuit 16 and error correction circuits 17-1 and 17-2. The receiver includes a four-diversity reception function and a two-TS output function. The number of diversity combinations and the number of outputs TS may be arbitrary. A plurality of error correction circuits may be provided. The diversity combining may not be performed.

Signals received by the antennas 10-1 to 10-4 are input to the tuners 11-1 to 11-4. The tuners 11-1 to 11-4 extract signals, which exist in a frequency band corresponding to a designated reception channel, from reception signals. Then, the tuners 11-1 to 11-4 convert the extracted signals to intermediate frequency (IF) signals and output the signals. The A/D conversion circuits 12-1 to 12-4 convert the output signals of the tuners 11-1 to 11-4 from analog signals to digital signals. The orthogonal demodulation circuits 13-1 to 13-4 convert the digital signals to complex baseband signals. The FFT circuits 14-1 to 14-4 perform fast fourier transform (FFT) on the complex baseband signals and convert time domain signals to frequency domain signals. Signals subjected to orthogonal frequency division multiplexing are demodulated and signals corresponding to a plurality of carriers are obtained.

The outputs of the FFT circuits 14-1 to 14-4 include data signals and scattered pilots (SP) used for synchronous detection. The outputs of the FFT circuits 14-1 to 14-4 include additional information transmission carriers (AC: Auxiliary Channel) used for additional information transmission and control information transmission carriers (TMCC: Transmission and Multiplexing Configuration Control) used for transmitting transmission parameter information or the like. The SP signals are BSPK-modulated and data signals are modulated using one of QPSK, 16 QAM, and 64 QAM. AC signals on the AC carriers and TMCC signals on the TMCC carriers are subjected to differential BPSK (DBPSK) modulation. The transmission channel equalization circuits 15-1 to 15-4 perform equalization process on the data signals output from the FFT circuits 14-1 to 14-4 based on the SP signals output from the FFT circuits 14-1 to 14-4. Transmission channel characteristics are equalized. The equalization-processed data signals are supplied to the diversity combining circuit 16. The diversity combining circuit 16, for example, may perform diversity combination on the equalized data signals received from four process lines of demodulation circuits. For example, reception data which has the largest reception intensity may be selected from among a plurality of process lines of reception data. The plurality of process lines of reception data may be combined by overlapping the phases of the reception data. The diversity combining circuit 16 supplies the reception data subjected to diversity combination to the error correction circuits 17-1 and 17-2.

FIGS. 2A, 2B, and 2C illustrate an exemplary diversity combination. The diversity combination illustrated in FIGS. 2A, 2B, and 2C may be performed by the diversity combining circuit 16 illustrated in FIG. 1. As illustrated in FIG. 2A, for example, dual process lines of received data may be combined and supplied to the error correction circuit 17-1 and the other dual process lines of received data may be combined and supplied to the error correction circuit 17-2. As illustrated in FIG. 2B, three process lines of received data may be combined and supplied to the error correction circuit 17-1 and received data corresponding to the other process line may be supplied to the error correction circuit 17-2. Three process lines of received data may be combined and supplied to the error correction circuit 17-2 and received data corresponding to the other process line may be supplied to the error correction circuit 17-1. As illustrated in FIG. 2B, four process lines of received data may be combined and supplied to the error correction circuit 17-1 and no received data may be supplied to the error correction circuit 17-2. Four process lines of received data may be combined and supplied to the error correction circuit 17-2 and no received data may be supplied to the error correction circuit 17-1.

FIG. 3 illustrates an exemplary error correction circuit. The error correction circuit illustrated in FIG. 3 may correspond to the error correction circuits 17-1 and 17-2 illustrated in FIG. 1. Diversity combining circuits 16-1 and 16-2 illustrated in FIG. 3 may correspond to the diversity combining circuit 16 illustrated in FIG. 1. The error correction circuit 17-1 may include a frequency de-interleave circuit 20-1, a demapping circuit 21-1, a time de-interleave circuit 22-1, a bit de-interleave circuit 23-1, a Viterbi decoding circuit 24-1, a byte de-interleave circuit 25-1, and an RS decoding circuit 26-1. The error correction circuit 17-1 may include a TMCC error correction circuit 27-1. Memories 28-1, 29-1, and 30-1 may be used by the frequency de-interleave circuit 20-1, the bit de-interleave circuit 23-1, and the byte de-interleave circuit 25-1, respectively. An error correction path with the error correction circuit 17-1 may be referred to as a first process line.

The error correction circuit 17-2 may include a frequency de-interleave circuit 20-2, a demapping circuit 21-2, a time de-interleave circuit 22-2, a bit de-interleave circuit 23-2, a Viterbi decoding circuit 24-2, a byte de-interleave circuit 25-2, and an RS decoding circuit 26-2. The error correction circuit 17-2 may include a TMCC error correction circuit 27-2. Memories 28-2, 29-2, and 30-2 may be used by the frequency de-interleave circuit 20-2, the bit de-interleave circuit 23-2, and the byte de-interleave circuit 25-2, respectively. An error correction path with the error correction circuit 17-2 may be referred to as a second processing line.

Under the control of a CPU 35, a diversity combining specification circuit 34 specifies the type of diversity combination. For example, one of diversity combining methods illustrated in FIGS. 2A, 2B, and 2C is specified. Diversity combining specification is supplied from the diversity combining specification circuit 34 to the diversity combining circuits 16-1 and 16-2. The diversity combining circuits 16-1 and 16-2 perform diversity combining based on the diversity combining specification. The diversity combining specification from the diversity combining specification circuit 34 is supplied to a memory control circuit 32. The memory control circuit 32 controls a memory 31 in response to the diversity combining specification.

Under the control of the CPU 35, a TS switching instruction circuit 33 instructs switching between TS output operations. For example, switching between a two-TS-output operation in which two TS outputs are output from the error correction circuits 17-1 and 17-2 respectively and a one-TS-output operation in which one TS output is output from either the error correction circuit 17-1 or 17-2 may be performed. A plurality of error correction circuits, more than three, may output a plurality of TS output, for example, more than three TS outputs which may be at a maximum. The TS switching instruction circuit 33 supplies TS switching information to the memory control circuit 32. The memory control circuit 32 controls the memory 31 in response to the TS switching information. The TS switching instruction circuit 33 controls the number of soft decision bits used in the Viterbi decoding circuits 24-1 and 24-2, according to TS switching.

The TMCC error correction circuit 27-1 performs error correction on a control information transmission carrier TMCC extracted from a reception signal in the first process line and obtains TMCC information, such as transmission parameter information or the like, based on the error correction result. The TMCC error correction circuit 27-2 performs error correction on a control information transmission carrier TMCC extracted from a received signal in the second process line and obtains TMCC information based on the error correction result. FIGS. 4A and 4B illustrate an exemplary allocation of the TMCC information. FIG. 4A illustrates TMCC carriers included in given locations of 204 symbols corresponding to symbol numbers 0 to 203. For example, three-bit data which includes TMCC signal values of three symbols corresponding to symbol numbers 28 to 30 indicates a current modulation method. FIG. 4B illustrates meanings assigned to data illustrated in FIG. 4A. For example, when three-bit data which indicates the current modulation method is "010", a 16 QAM modulation method is used. The TMCC error correction circuits 27-1 and 27-2 supply extracted information, which relates to a data modulation method and a time interleave length, to the memory control circuit 32. The memory control circuit 32 controls the memory 31 in response to the supplied information which relates to the data modulation method and the time interleave length.

The memory 31 is shared by the time de-interleave circuits 22-1 and 22-2. The time de-interleave circuit 22-1 de-interleaves first received data subjected to demodulation process and soft decision process. The time de-interleave circuit 22-2 de-interleaves second received data subjected to demodulation process and soft decision process. Hard decision information and soft decision information of the first received data and the second received data are stored in the memory 31. The memory control circuit 32 varies the number of bits stored in the memory for the hard decision information of the first data, the soft decision information of the first data, the hard decision information of the second data, and the soft decision information of the second data. The number of bits may be varied dynamically. With respect to the first reception data and the second reception data, the memory control circuit 32 varies the number of bits stored in the memory based on at least one of information indicating the validity or the invalidity of a TS output, a data modulation method, a time interleave length, and the number of diversity combinations. The information which indicates the validity or the invalidity of the TS output for example, information which relates to the TS output for the first received data and the second received data, is supplied from the TS switching instruction circuit 33. Information which relates to the data modulation method and the time interleave length is supplied from the TMCC error correction circuits 27-1 and 27-2. Information which relates to the number of diversity combinations is supplied from the diversity combining specification circuit 34. In another de-interleave processing such as frequency de-interleave process or the like, a memory may be shared and the number of bits may be reduced.

The demapping circuits 21-1 and 21-2 illustrated in FIG. 3 perform demapping process. In the demapping process, the data transmission point of data transmitted from a transmitting side is hard-decided.

Figure 5:
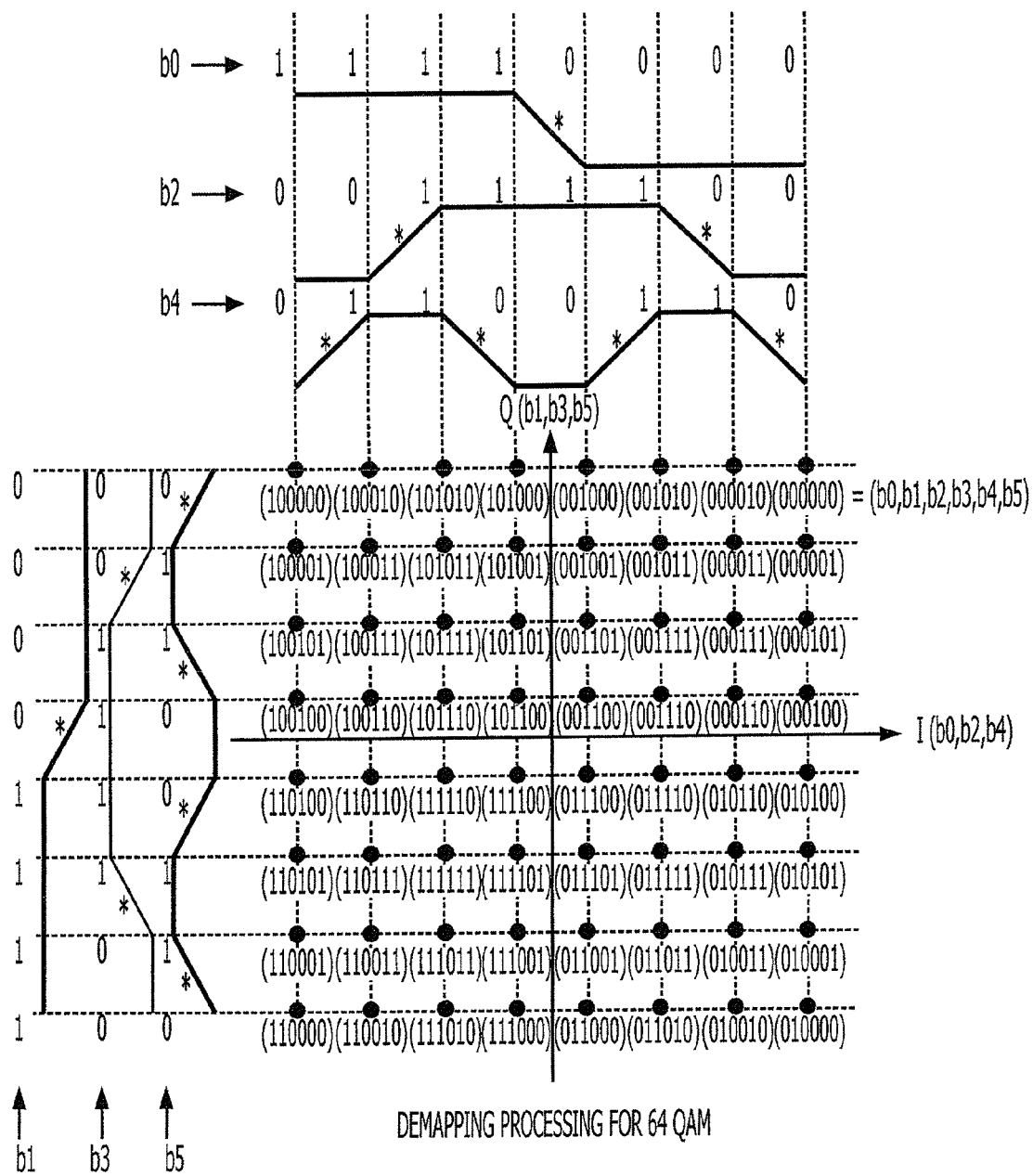
FIG. 5 illustrates an exemplary hard decision process.

FIG. 5 illustrates an exemplary hard decision process. A modulation method illustrated in FIG. 5 may be 64 QAM.

For example, in the received signals subjected to transmission path equalization by the transmission path equalization circuits 15-1 and 15-4, a signal point which is at a short distance from the received signal is specified among 64 signal points of 64 QAM, which exist on a complex plane illustrated in FIG. 5. The specified signal point is estimated to be a transmission point. In 64 QAM, three-bit hard decision information which indicates eight locations in an I axis direction and three-bit hard decision information which indicates eight locations in a Q axis direction, for example, six-bit hard decision information in all, are obtained. B0, b1, b2, b3, b4, and b5 illustrated in FIG. 5 indicate the hard decision information. When the modulation method is 16 QAM, four-bit hard decision information is obtained by combining four bits from the I axis and the Q axis. When the modulation method is QPSK, two-bit hard decision information is obtained by combining two bits from the I axis and the Q axis. Error correction is performed by using Viterbi decoding based on the hard decision information, so that transmission data is obtained. A decoding error may occur. In addition to the hard decision information indicating "0" or "1", soft decision information which indicates a decision result by using a value between "0" and "1" is obtained by finely dividing a distance between a current location for the hard decision and an adjacent location for the hard decision. The soft decision information may be used for the Viterbi decoding. A decoding error may be reduced.

A location of an asterisk "*" illustrated in FIG. 5 may be a candidate for a soft decision point. Between two adjacent signal points whose locations are different from each other on the I axis, a bit value, which corresponds to one of three bits, b1, b3, and b5, the three bits indicating a location on the I axis, may be different from each other. Between two adjacent signal points whose locations are different from each other on the Q axis, a bit value, which corresponds to one of three bits, b0, b2, and b4, the three bits indicating a location on the Q axis, may be different from each other. A value between "0" and "1" is determined by using 16 values ranging from "0000" to "1111" in order to indicate the accuracy of a signal point using, for example, four-bit soft decision information. How close the value is to either "0" or "1" is indicated. Since the most significant bit coincides with the hard decision, the number of bits used for the soft decision information may be six bits in all, by combining three bits from the I axis and three bits from the Q axis. The number of bits used for the soft decision information may include four-bit location information, which includes two-bit location information of the soft decision for one of three bits indicating a location on the I axis and two-bit location information of the sift decision for one of three bits indicating a location on the Q axis. The number of bits used for the four-bit soft decision process in 64 QAM may include six bits used for the hard decision information, six bits used for the accuracy information of the soft decision information, and four bits used for the location information of the soft decision information.

FIG. 6 illustrates an exemplary number of bits used for soft decision information. In FIG. 6, the number of bits used for the soft decision information varies with the modulation method used. The number of bits used for the four-bit soft decision process in 64 QAM may be, for example, 16 bits as illustrated in FIG. 6. The number of bits used for three-bit soft decision process in 16 QAM may be 10 bits. In time de-interleave process, data corresponding to the time duration specified in a standard is accumulated, each piece of the data having the number of bits illustrated in FIG. 6. According to a standard for terrestrial digital broadcasting, when a time interleave length I is "4" in a reception mode 3, the largest amount of data may be accumulated. In full-segment reception (13-segment reception), 948480 signal points (=72960*13 (segment)) may be accumulated. In the four-bit soft decision process in the modulation method 64 QAM, memory capacity corresponds to 15175680 bits (=948480*16) and is smaller than memory capacity which is used for two-processing-line time interleave process and corresponds to 2*15175680 bits. For example, when the time interleave length I is "4" in the reception mode 3, the memory capacity of the memory 31 may correspond to the capacity of a memory in one process line used for the four-bit soft decision process in the modulation method 64 QAM, for example, 15175680 bits.

Figure 7:
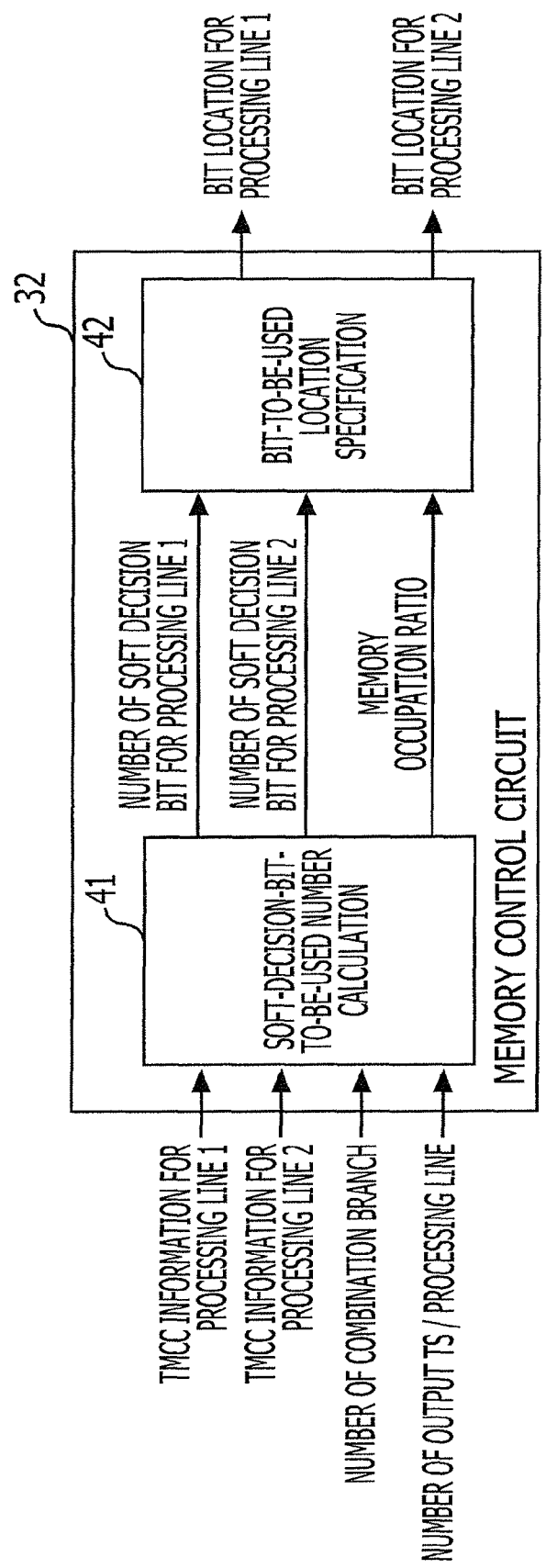
FIG. 7 illustrates an exemplary memory control circuit.

FIG. 7 illustrates an exemplary memory control circuit. The memory control circuit illustrated in FIG. 7 may be the memory control circuit illustrated in FIG. 3. The memory control circuit 32 includes a soft-decision-bit-to-be-used number calculation circuit 41 and a bit-to-be-used location specification circuit 42. The soft-decision-bit-to-be-used number calculation circuit 41 receives first-process-line TMCC information from the TMCC error correction circuit 27-1 and second-process-line TMCC information from the TMCC error correction circuit 27-2. The TMCC information includes, for example, information relating to a data modulation method and a time interleave length. The soft-decision-bit-to-be-used number calculation circuit 41 receives information, which indicates the number of combination branches, from the diversity combining specification circuit 34. The information, which indicates the number of combination branches, includes the number of first-process-line diversity combinations and the number of second-process-line diversity combinations. Examples of the diversity combinations include the case where dual-process-line combination is performed in the first process line and the second process line, the case where three-process-line combination and one-process-line combination are performed in the first process line and the second process line, respectively (or vice versa), and the case where four-process-line combination is performed in either the first process line or the second process line. The soft-decision-bit-to-be-used number calculation circuit 41 receives information, which indicates the number of outputs TS and the number of output lines, from the TS switching instruction circuit 33. The information includes information which indicates whether or not TSs of the first process line and the second process line are output.

The soft-decision-bit-to-be-used number calculation circuit 41 determines the number of soft decision bits used for error correction processing based on the information. For example, when a data modulation method used for the first process line has higher noise tolerance than a data modulation method used for the second process line, the number of soft decision bits used for the first process line may be smaller than the number of soft decision bits used for the second process line. For example, when the number of first-process-line diversity combinations is larger than the number of second-process-line diversity combinations, for example, when noise is smaller, the number of soft decision bits used for the first process line may be smaller than the number of soft decision bits used for the second process line. With respect to the first received data and the second received data, the soft-decision-bit-to-be-used number calculation circuit 41 determines the number of soft decision bits respectively based on the validity or the invalidity of a TS output, a data modulation method, a time interleave length, and the number of diversity combinations or the like. The determination may be performed dynamically. The soft-decision-bit-to-be-used number calculation circuit 41 calculates a memory occupation ratio between the first process line and the second process line based on the information. For example, when the hard decision process is performed in 64 QAM, for example, when the number of soft decision bits is "1", the number of bits assigned to one signal point may be six bits. When the three-bit soft decision process is performed in 16 QAM, the number of bits assigned to one signal point may be 10 bits. For example, in the first process line, six bits may be used for the hard decision process performed in 64 QAM, and, in the second process line, 10 bits may be used for the three-bit soft decision process performed in 16 QAM. The memory occupation ratio may turn out to be 6:10.

The bit-to-be-used location specification circuit 42 receives the number of soft decision bits in the first process line, the number of soft decision bits in the second process line, and the memory occupation ratio between the first process line and the second process line. The bit-to-be-used location specification circuit 42 outputs a signal which specifies a bit location used for the first process line and a signal which specifies a bit location used for the second process line based on the information.

Figure 8:
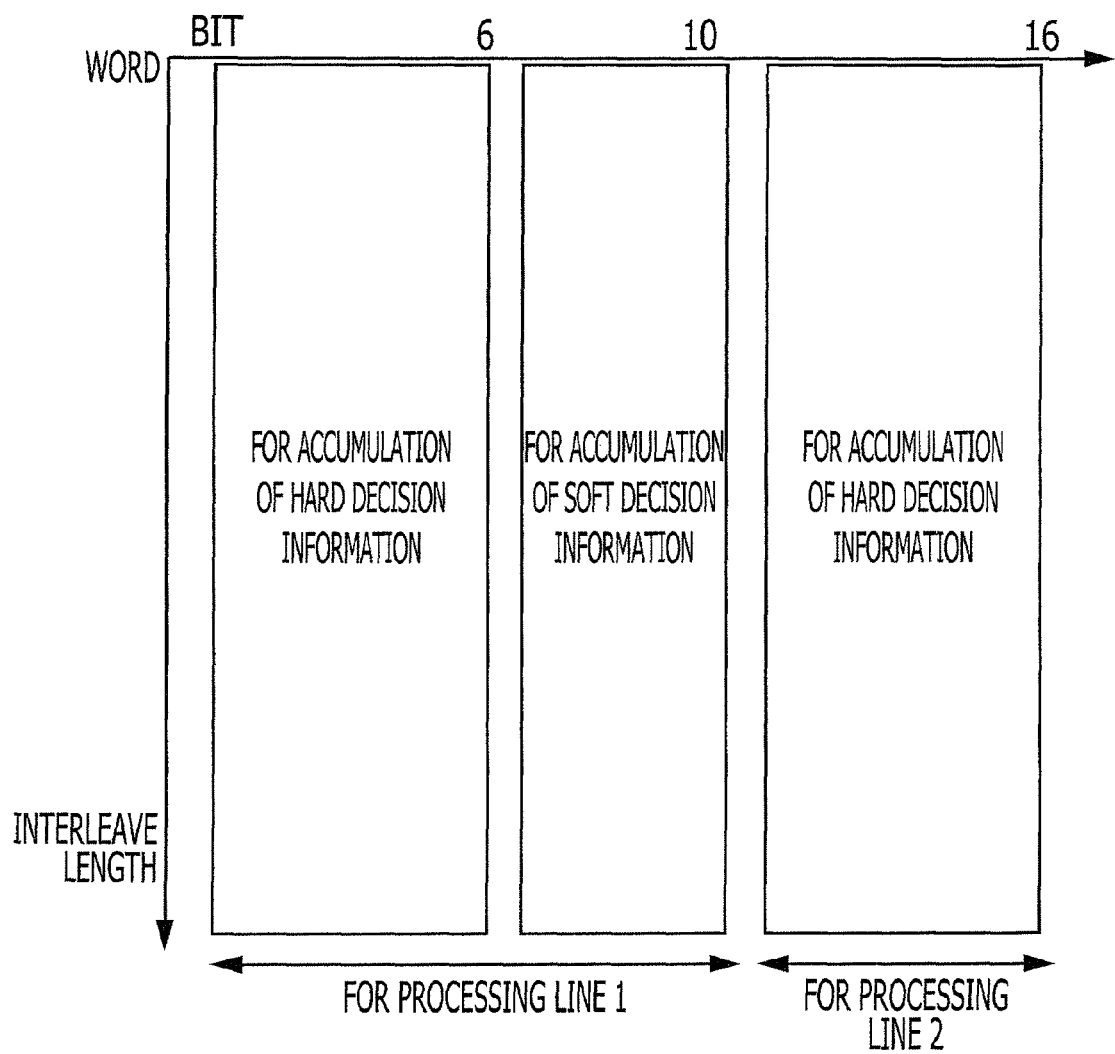
FIG. 8 illustrates exemplary bit locations.

FIG. 8 illustrates an exemplary bit location. FIG. 8 may illustrate the memory space of the memory 31. A longitudinal direction in FIG. 8 corresponds to an interleave length which indicates an address of a memory storage location. A lateral direction in FIG. 8 corresponds to a bit location in one word. One word may correspond to 16 bits. The hard decision information in the first process line is stored in six bits ranging from bit 1 to bit 6 of each word in the memory 31, the soft decision information in the first process line is stored in four bits ranging from bit 7 to bit 10, and the hard decision information in the second process line is stored in six bits ranging from bit 11 to bit 16. At the time of writing data into the memory 31, bit masking is performed in response to the signal which specifies the bit location used for the first process line and the signal which specifies the bit location used for the second process line. All the data at one signal point used for the four-bit soft decision process in 64 QAM, for example, the hard decision information and the soft decision information may be stored in one word.

Figure 9:
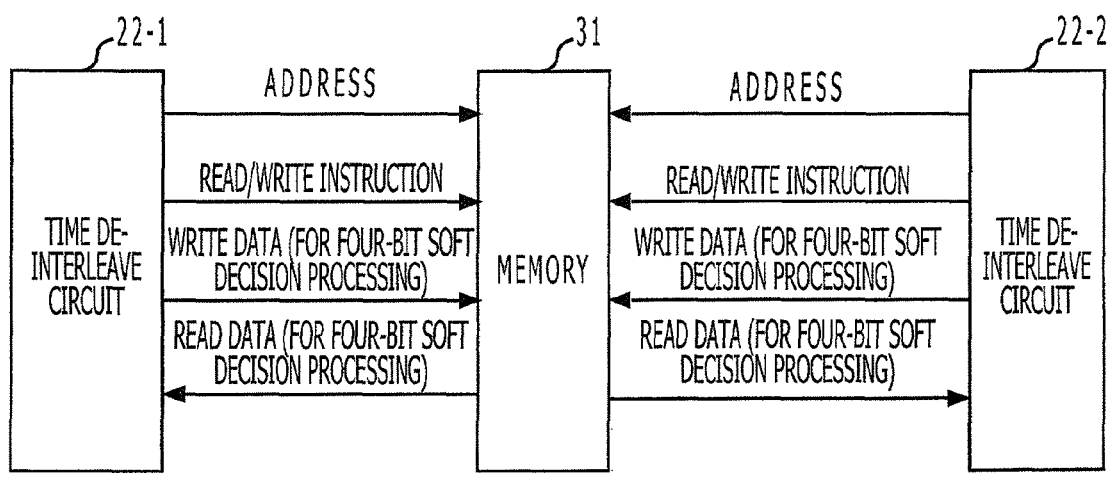
FIG. 9 illustrates an exemplary time de-interleave circuit.

FIG. 9 illustrates an exemplary time de-interleave circuit. FIG. 9 may illustrate connections between the time de-interleave circuit and the memory, both shown in FIG. 3. Time de-interleave circuits 22-1 and 22-2 supply address signals and read/write instruction signals to a memory 31. The time de-interleave circuits 22-1 and 22-2 specify an address, assert a write instruction, and write one word, for example, 16-bit write data. When a write destination word is occupied by data in one process line, the number of bits at one signal point used for the four-bit soft decision process in 64 QAM may be written. When one write destination word is occupied by data in two process lines, data whose number of bits is smaller than 16 bits is written. The memory 31 is controlled, for example, by the memory control circuit 32 illustrated in FIG. 7. Write data from the time de-interleave circuit 22-1 is bit-masked so that the write data is written at a storage bit location in the first process line. For example, as illustrated in FIG. 8, the write data from the time de-interleave circuit 22-1 may be written into 10 bits ranging from bit 1 to bit 10. Write data from the time de-interleave circuit 22-2 is bit-masked so that the write data is written at a storage bit location in the second process line. The write data from the time de-interleave circuit 22-2 may be written into six bits ranging from bit 11 to bit 16.

When each of the time de-interleave circuits 22-1 and 22-2 specifies an address and asserts a read instruction, one word, for example, 16-bit read data, is read out. When one word is occupied by data in one process line, the number of bits at one signal point used for the four-bit soft decision process in 64 QAM is read out. When one word is occupied by data in two process lines, valid bit data is not stored in given bits from among the read-out 16-bit read data. Read data for the time de-interleave circuit 22-1 is stored at storage bit locations in the first process line. Bit masking is performed by inserting "0" at other bit locations. Read data for the time de-interleave circuit 22-2 is stored at storage bit locations in the second process line. Bit masking is performed by inserting "0" at other bit locations. Data at bit locations at which "0" is inserted may not be used in Viterbi decoding. The memory 31 may be a single-port memory. The time de-interleave circuit 22-1 and 22-2 may access the memory 31 at different times, respectively.

Figure 10:
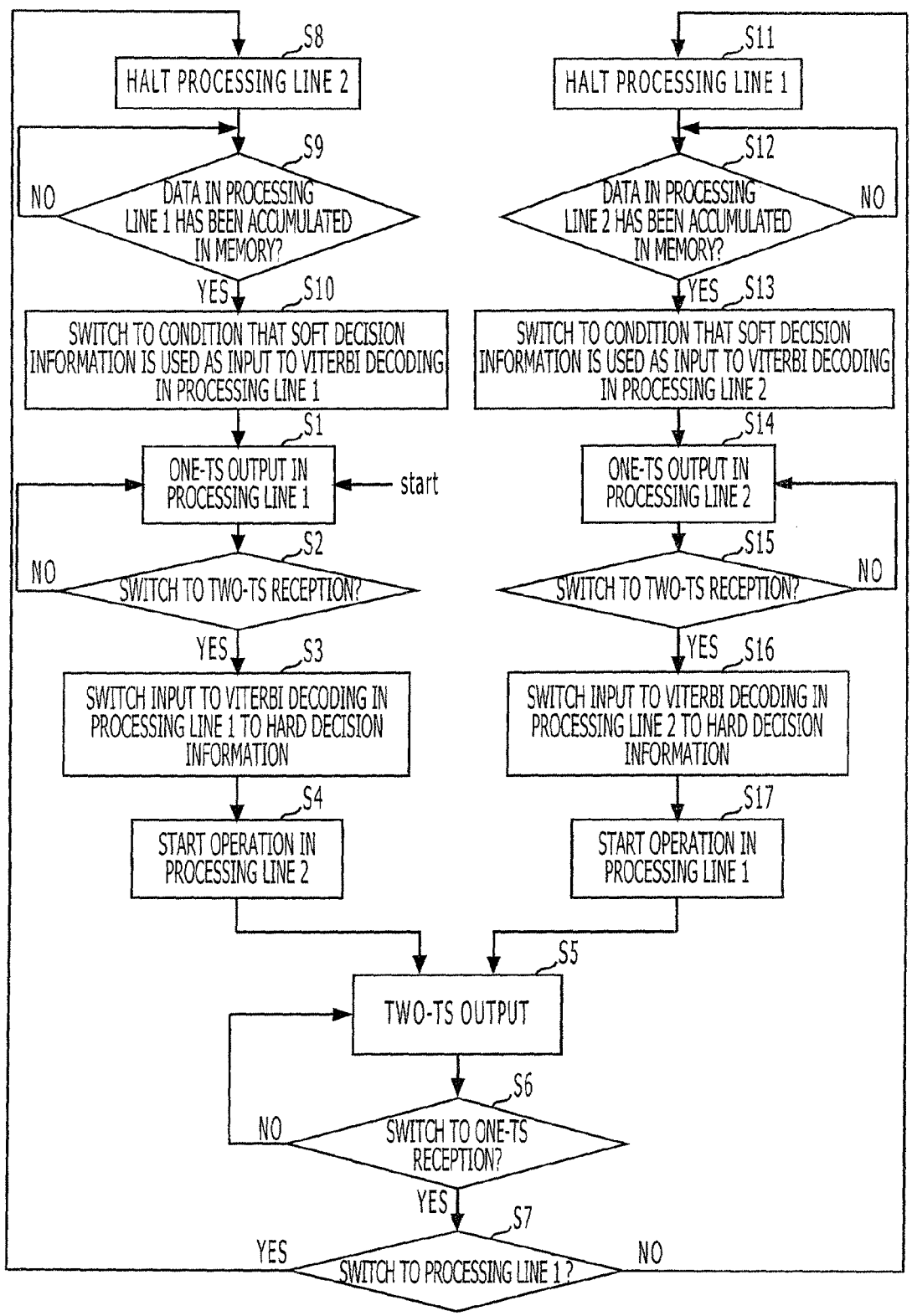
FIG. 10 illustrates an exemplary switching process.
Figure 11:
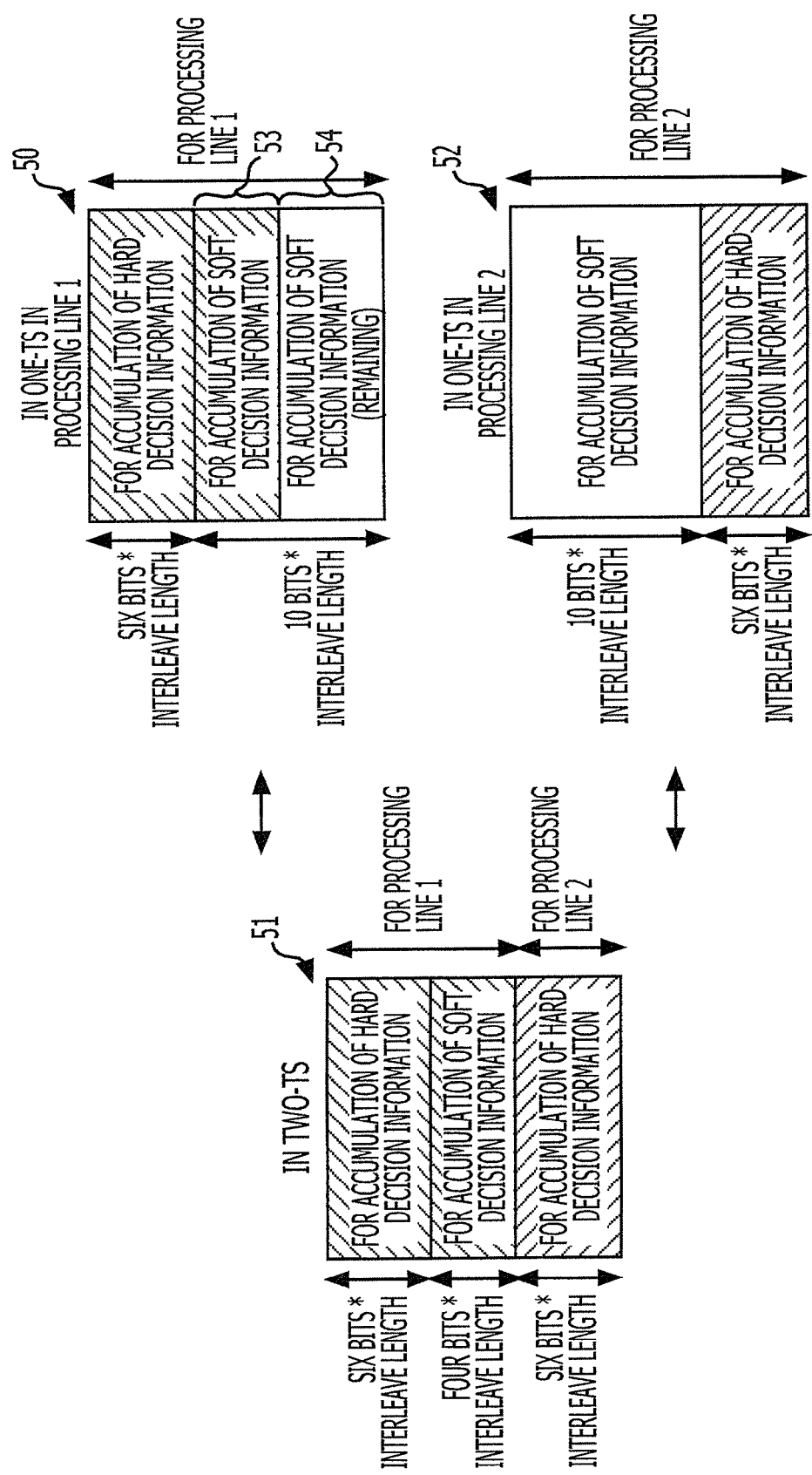
FIG. 11 illustrates an exemplary switching process.

FIG. 10 illustrates an exemplary switching process. In FIG. 10, switching between a two-TS-output configuration and a one-TS-output configuration is performed. FIG. 11 illustrates an exemplary switching process. In FIG. 11, switching between a two-TS-output configuration and a one-TS-output configuration is performed in 64 QAM. In Operation S1 illustrated in FIG. 10, the first process line operates in the one-TS-output configuration. For example, as a bit configuration 50 illustrated in FIG. 11, six bits from among 16 bits included in one word may be assigned to the hard decision information in the first process line and the remaining 10 bits may be assigned to the soft decision information in the first process line. During time de-interleave process, the time de-interleave circuit 22-1 in the first process line writes data into the memory 31 based on the bit configuration 50 illustrated in FIG. 11. For example, when the four-bit soft decision process in 64 QAM illustrated in FIG. 6 is performed, 16-bit data may be written. The Viterbi decoding circuit 24-1 illustrated In FIG. 3, subsequently coupled to the time de-interleave circuit 22-1, decodes using the four bit-soft decision information.

In Operation S2, whether or not switching to two-TS reception is specified is determined. When switching to two-TS reception is specified, the hard decision information is input to Viterbi decoding in the first process line in Operation S3. The Viterbi decoding circuit 24-1 uses the hard decision information. When the first process line uses the hard decision information and the soft decision information after the switching, the hard decision information and the soft decision information may be used in Viterbi decoding. In Operation S4, the second process line starts an operation and a portion of a part used by the first process line in the memory 31 is yielded to the second process line. For example, as a bit configuration 51 illustrated in FIG. 11, leading six bits from among 16 bits of one word are assigned to the hard decision information in the first process line, trailing six bits are assigned to the hard decision information in the second process line, and the remaining four bits are assigned to the soft decision information in the first process line. For example, when the three-bit soft decision process in 64 QAM is performed, the number of bits may be 14. When the three-bit soft decision process is performed either in the I axis or the Q axis, process is performed using 10 (=6+(14−6)/2) bits. In the first process line, the three-bit soft decision processing in 64 QAM may be performed either in the I axis or the Q axis using 10 bits, and, in the second process line, hard decision process in 64 QAM may be performed using six bits.

In Operation S5, an operation in the two-TS-output configuration is performed. At the time of time de-interleave process, the time de-interleave circuit 22-1 in the first process line writes 10 bits based on the bit configuration 51 illustrated in FIG. 11. In Viterbi decoding of the Viterbi decoding circuit 24-1, the three-bit soft decision information is used in one of the I axis and the Q axis, and the hard decision information is used in the other axis. At the time of time de-interleave process, the time de-interleave circuit 22-2 in the second process line writes six bits based on the bit configuration 51 illustrated in FIG. 11. In Viterbi decoding of the Viterbi decoding circuit 24-2, the soft decision information is used.

Storage bit locations of the hard decision information in the first process line and a portion 53 of storage bit locations of the soft decision information in the first process line, illustrated in the bit configuration 50, are switched to storage bit locations of the hard decision information in the first process line and storage bit locations of the soft decision information in the first process line, illustrated in the bit configuration 51. Since the hard decision information and the soft decision information, used after the switching, are stored at a certain memory-locations for storing the information used before the switching, the switching may performed seamlessly. The number of bits used in the Viterbi decoding before the switching is preliminarily set to the number of bits used in the Viterbi decoding after the switching, so that seamless switching may be performed.

In Operation S6, whether or not switching to one-TS reception is specified is determined. After switching to one-TS reception is specified, when, in Operation S7, whether or not switching to the first process line is performed is determined and the switching to the first process line is performed, the operation in the second process line is halted and a part occupied by the second processing line in the memory 31 is yielded to the first processing line, in Operation S8. For example, as the bit configuration 50 illustrated in FIG. 11, six bits from among 16 bits of one word are assigned to the hard decision information in the first process line and the other 10 bits are assigned to the soft decision information in the first processing line. In Operation 9, whether or not data in the first process line is accumulated in the memory 31 is determined. Whether or not data corresponding to a part 54 of the soft decision information in the bit configuration 50 illustrated in FIG. 11 is accumulated is determined. In the other part, the information may be accumulated before the switching. When, in Operation S9, when data in the first process line is accumulated in the memory 31, the soft decision information is used in the Viterbi decoding in the first process line, in Operation S10. The Viterbi decoding circuit 24-1 performs maximum likelihood decision by using all the soft decision information.

Storage bit locations of the hard decision information in the first process line and a portion 53 of storage bit locations of the soft decision information in the first process line, illustrated in the bit configuration 51, are switched to storage bit locations of the hard decision information in the first process line and storage bit locations of the soft decision information in the first process line, illustrated in the bit configuration 50. Since the hard decision information and the soft decision information, used after the switching, are stored at certain memory-locations for storing the information used before the switching, the switching may be performed seamlessly. The number of bits used in the Viterbi decoding before the switching is preliminarily set to the number of bits used in the Viterbi decoding after the switching, so that seamless switching may be performed. After data 54 is accumulated in the memory after the switching, the number of bits is modified for the Viterbi decoding.

When, in Operation S7, when switching to the second process line is performed, the operation in the first process line is halted and a part occupied by the first process line in the memory 31 is yielded to the second process line, in Operation S11. For example, as a bit configuration 52 illustrated in FIG. 11, six bits from among 16 bits of one word are assigned to the hard decision information in the second process line and the other 10 bits are assigned to the soft decision information in the second process line. In Operation 12, whether or not data in the second process line has been accumulated in the memory 31 is determined. When data in the second process line is accumulated in the memory 31, the soft decision information is used in the Viterbi decoding in the second process line, in Operation S13. The Viterbi decoding circuit 24-2 performs maximum likelihood decision using the soft decision information.

In Operation S14, an operation in the one-TS-output configuration is performed in the second process line. Operations S16 and S17 may be substantially the same as or similar to Operations S3 and S4.

Figure 12:
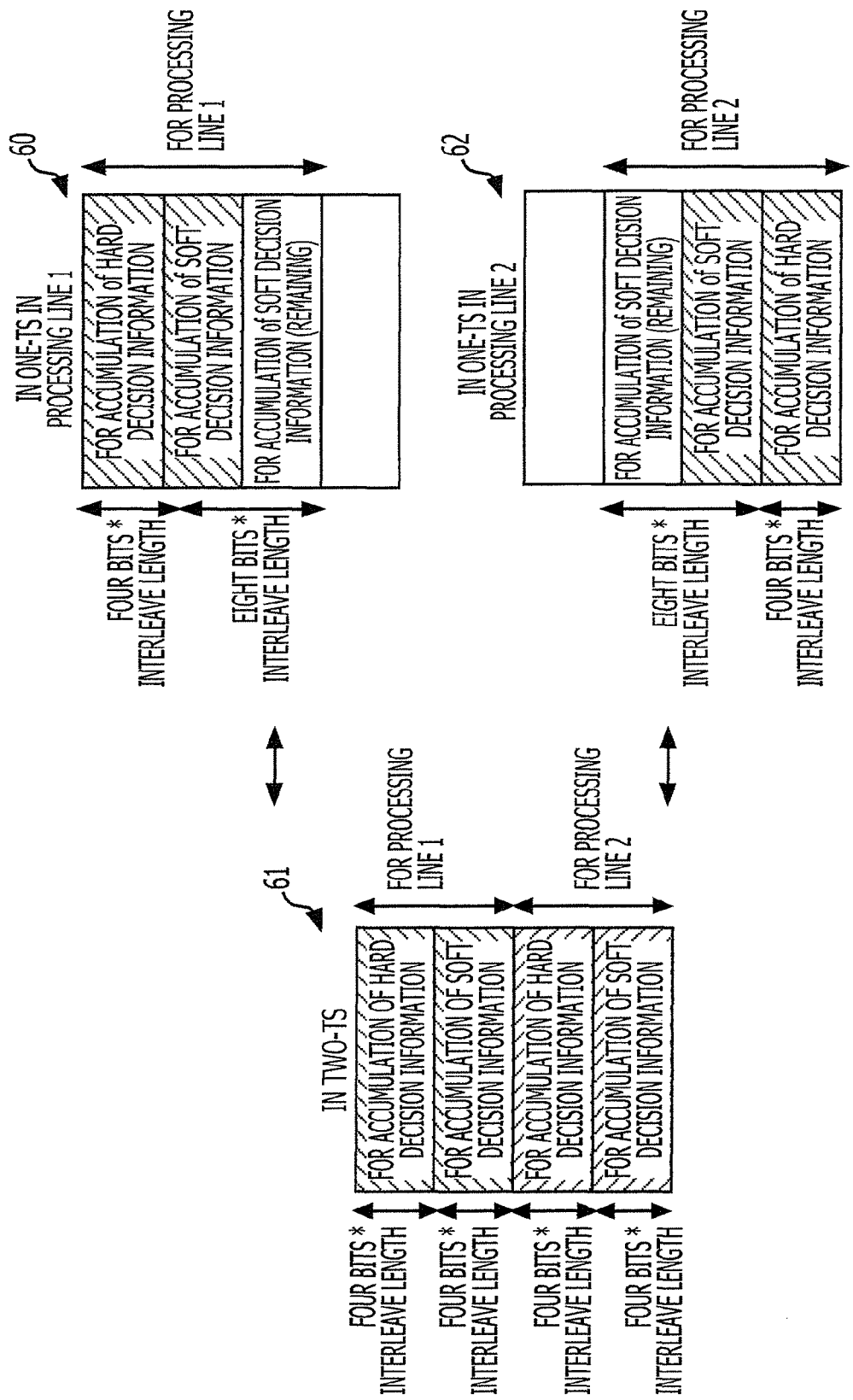
FIG. 12 illustrates an exemplary switching process.

FIG. 12 illustrates an exemplary switching process. In FIG. 12, switching between the two-TS-output configuration and the one-TS-output configuration is performed in 16 QAM. In the one-TS-output configuration, for example, as a bit configuration 60 illustrated in FIG. 12, four bits from among 16 bits included in one word are assigned to the hard decision information in the first process line and eight bits from among the remaining 12 bits are assigned to the soft decision information in the first process line. For example, when the four-bit soft decision process in 16 QAM illustrated in FIG. 6 is performed, 12-bit data is written. When switching to the two-TS-output configuration is performed, leading four bits from among 16 bits of one word are assigned to the hard decision information in the first process line and trailing four bits are assigned to the hard decision information in the second process line, as a bit configuration 61. Four bits, one half of the remaining eight bits, are assigned to the soft decision information in the first process line and four bits, the other half of the remaining eight bits, are assigned to the soft decision information in the second process line. For example, as illustrated in FIG. 6, the number of bits used for two-bit soft decision process in 16 QAM may be eight, for example, four bits, one half of the eight bits, used for hard decision and the other four bits used for soft decision. In the first and second process lines, the two-bit soft decision process in 16 QAM may be performed and 16 bits may be used in units of eight bits. Switching from the two-TS-output configuration to, for example, the one-TS-output configuration in the second process line, illustrated in a bit configuration 62, is performed. In the bit configuration 62, for example, four bits from among 16 bits included in one word are assigned to the hard decision information in the second process line and eight bits from among the remaining 12 bits are assigned to the soft decision information in the second process line. For example, the four-bit soft decision process in 16 QAM, whose number of bits is 12 bits, may be performed. The switching illustrated in FIG. 12 may be performed seamlessly.

Figure 13:
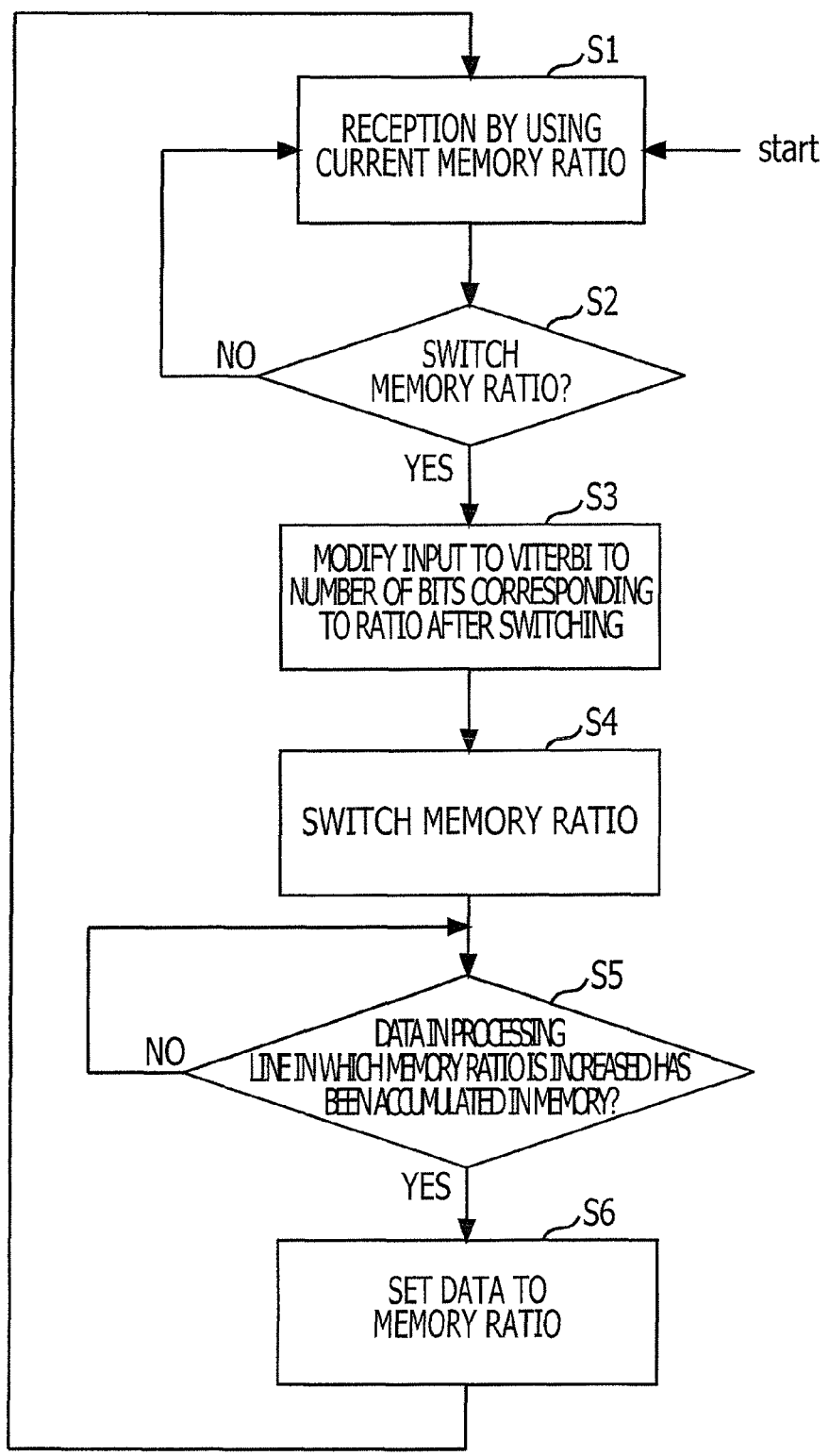
FIG. 13 illustrates an exemplary memory ratio switching process.

FIG. 13 illustrates an exemplary memory ratio switching process. In FIG. 13, the two-TS-output configuration may be adopted. In Operation S1, a reception operation is performed using a current memory ratio. In Operation S2, whether or not the memory ratio is switched is determined. For example, when a modulation method is switched, when the number of diversity combinations is switched, or when a time interleave length is switched, the memory ratio may be switched. When the memory ratio is switched, the bit width of input data for Viterbi decoding in a process line in which the memory ratio is reduced is set to a bit width which corresponds to the memory ratio set after the switching in Operation S3. For example, in the bit configuration of the first process line corresponding to four-bit for soft decision process in 16 QAM, the number of bits used for soft decision processing in 16 QAM is switched to two bits.

In Operation S4, the memory ratio is switched. In the first and second process lines, bit configurations in the memory 31 are switched. Switching from a configuration in which data in the first process line is stored in 12-bit width and data in the second process line is stored in four-bit width to a configuration in which data in the first process line is stored in four-bit width and data in the second process line is stored in 12-bit width is performed. In Operation S5, whether or not data in a process line where the memory ratio is increased is accumulated in the memory is determined. For example, whether or not data increased owing to the switching is accumulated in the memory is determined. When the data is accumulated in the memory, the bit width of input data for Viterbi decoding in a process line where the memory ratio is increased is set to a bit width which corresponds to the memory ratio set after the switching, in Operation S6. For example, when the bit configuration in the second process line before the switching corresponds to one-bit for soft decision process in 16 QAM, the bit configuration is switched to the bit configuration corresponding to two-bit for soft decision process in 16 QAM. The number of bits used for soft decision used in the Viterbi decoding in the second process line increases from one bit to two bits.

De-interleave process in the first process line and de-interleave process in the second process line may be performed seamlessly at the time of the switching. During execution of de-interleave process in the first process line and de-interleave process in the second process line, the number of bits used for the Viterbi decoding is modified and the bit configuration of the memory is switched.

In terrestrial digital broadcasting, the time interleave length I corresponding to 12 segments may be "2". In comparison with the time interleave length I which is "4" in the reception mode 3, the amount of data accumulated may be a half.

The TMCC information includes information relating to a time interleave length and a data modulation method. When the TMCC information is switched, a transmission parameter switching index included in the TMCC information is sequentially counted down from "1111" one by one. After the transmission parameter switching index reaches "0000", the TMCC information is switched at the time of returning to "1111". FIGS. 4A and 4B illustrate a transmission location of the transmission parameter switching index and the content thereof. With respect to the modulation method and the time interleave length or the like, current information and next information are specified. When the transmission parameter switching index is counted down, a parameter to be used next is specified as the next information. For example, the number of bits used for the Viterbi decoding may be decreased based on the next information.

Figure 14:
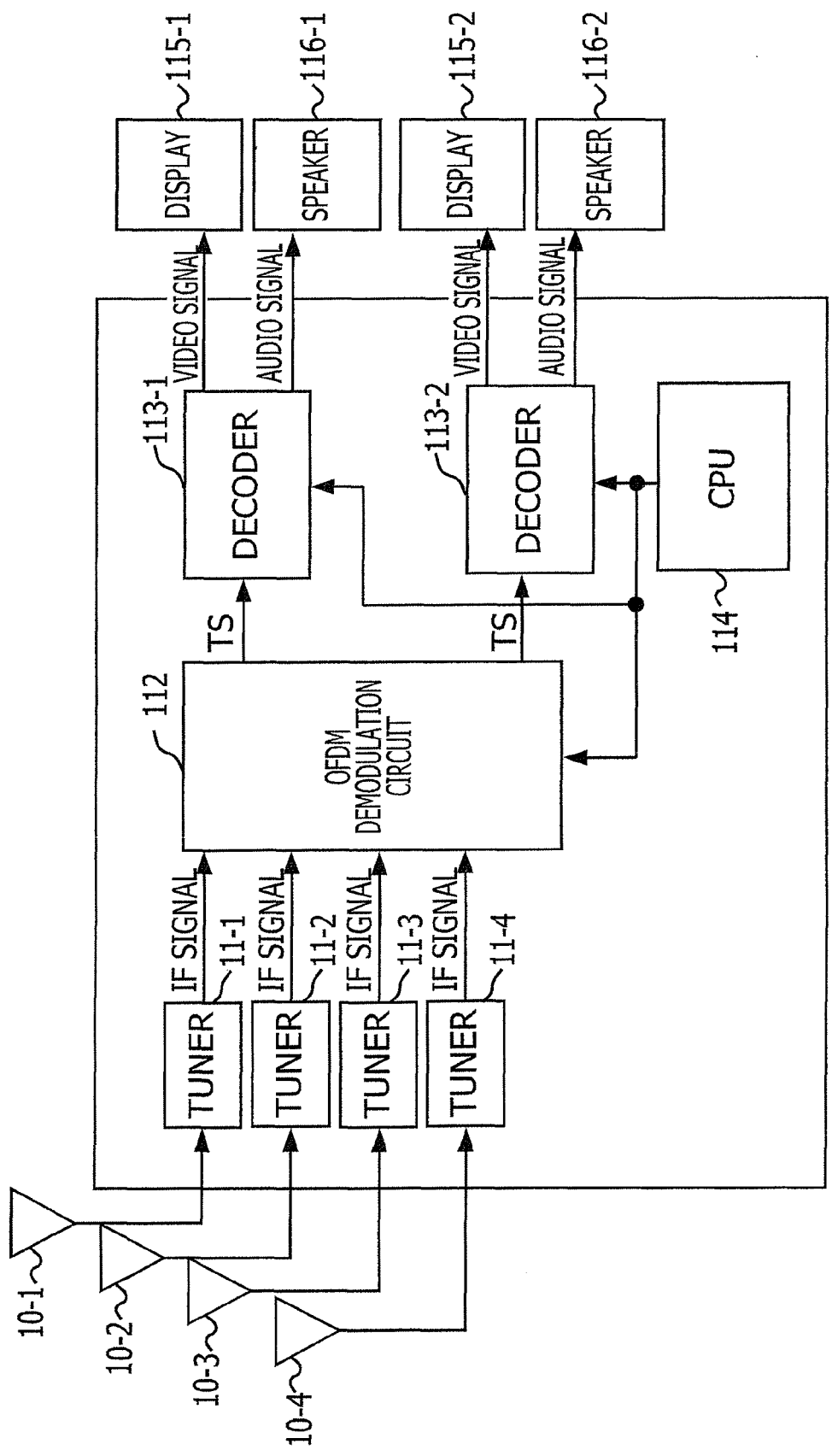
FIG. 14 illustrates an exemplary receiving system.

FIG. 14 illustrates an exemplary receiving system. The receiving system illustrated in FIG. 14 includes an OFDM demodulating circuit. In FIG. 14, elements which are substantially the same as or similar to elements illustrated in FIG. 1 are assigned with the same numbers and descriptions of the components may be omitted and reduced. The receiving system includes antennas 10-1 and 10-4, tuners 11-1 and 11-4, an OFDM demodulating circuit 112, decoders 113-1 and 113-2, a CPU 114, displays 115-1 and 115-2, and speakers 116-1 and 116-2. The tuners 11-1 and 11-4 receive signals received by the antennas 10-1 and 10-4 and outputs IF signals. The OFDM demodulating circuit 112 may not include the antennas 10-1 and 10-4 and the tuners 11-1 and 11-4, illustrated in FIG. 1. The other configuration may be substantially the same as or similar to the configuration illustrated in FIG. 1. The OFDM demodulating circuit 112 receives the IF signals and outputs OFDM-demodulated digital signals as transport streams TS. The decoders 113-1 and 113-2 decode the transport streams TS and generate output signals including video signals and audio signals. The CPU 114 controls the OFDM demodulating circuit 112 and the decoders 113-1 and 113-2. The displays 115-1 and 115-2 output video based on the video signals. The speakers 116-1 and 116-2 output audio based on the audio signals. The receiving system adopts a two-TS output function. The decoders 113-1 and 113-2, the displays 115-1 and 115-2, and the speakers 116-1 and 116-2 may be provided.

The previous aspects of the embodiments may be adapted to a system where a plurality of interleave process sections in a plurality of reception signal process systems share a memory.

Example embodiments of the present invention have now been described in accordance with the above advantages. It will be appreciated that these examples are merely illustrative of the invention. Many variations and modifications will be apparent to those skilled in the art.

The invention claimed is:

1. A data processing method comprising:
de-interleaving a first data which is demodulated and is soft-decision-processed using a first number of bits;
de-interleaving a second data which is demodulated and is soft-decision-processed using a second number of bits;
reducing at least one of a first soft-decision number of bits for a first Viterbi decoding corresponding to the first data and a second soft-decision number of bits for a second Viterbi decoding corresponding to the second reception data, and modifying at least one of the first number and the second number while de-interleaving at least one of the first data and the second data;
de-interleaving at least one of the first data and the second data using at least one of a modified first number and a second modified number; and
increasing at least one of the first soft-decision bit and the second soft-decision bit which is not reduced while de-interleaving at least one of the first data and the second data.

2. The data processing method according to claim 1, wherein at least one of the first number and the second number is modified based on at least one of information indicating a validity or an invalidity of a TS output, a data modulation method, a time interleave length, and the number of diversity combinations.

3. The data processing method according to claim 2, wherein at least one of the first number and the second number of bits is modified dynamically.

4. The data processing method according to claim 1, wherein hard decision information of the first data and hard decision information of the second data are stored at a certain location in memory.

* * * * *